(12) United States Patent
Sasada et al.

(10) Patent No.: US 7,593,445 B2
(45) Date of Patent: Sep. 22, 2009

(54) SEMICONDUCTOR OPTICAL DEVICE AND OPTICAL TRANSMISSION MODULE

(75) Inventors: Noriko Sasada, Yokosuka (JP); Kazuhiko Naoe, Yokohama (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 11/668,204

(22) Filed: Jan. 29, 2007

(65) Prior Publication Data
US 2007/0297475 A1 Dec. 27, 2007

(30) Foreign Application Priority Data
Jun. 27, 2006 (JP) .............................. 2006-176655

(51) Int. Cl.
*H01S 5/00* (2006.01)
(52) U.S. Cl. ...................... 372/50.11; 372/50.1; 372/26
(58) Field of Classification Search .............. 372/50.11, 372/50.1, 26; 257/85, 95, 98; 359/245, 248, 359/249
See application file for complete search history.

(56) References Cited

U.S. PATENT DOCUMENTS

| | | | |
|---|---|---|---|
| 5,764,670 A * | 6/1998 | Ouchi | 372/45.01 |
| 6,574,260 B2 * | 6/2003 | Salvatore et al. | 372/50.11 |
| 6,771,682 B2 * | 8/2004 | Peters | 372/50.1 |

OTHER PUBLICATIONS

"Ru-doped Semi-insulating Buried Heterostructure Laser Operating up to 100° C for 10-Gbit/s Direct Modulation", R. Iga, et al. ECOC2005, Tu4.5.2.
C. Rolland et al., "InGaAsP-based Mach-Zehnder modulator for high-speed transmission systems", OFC'98 ThH1, pp. 283-284.

* cited by examiner

*Primary Examiner*—Minsun Harvey
*Assistant Examiner*—Kinam Park
(74) *Attorney, Agent, or Firm*—Brundidge & Stanger, P.C.

(57) ABSTRACT

A semiconductor optical device has a semiconductor laser portion and a modulator portion which have different mesa structures. The mesa structure of the semiconductor laser portion is a ridge waveguide structure which has air around the mesa. The mesa structure of the modulator portion is a planarized ridge waveguide structure which has an organic insulator buried around the mesa.

19 Claims, 8 Drawing Sheets plan view

A-A' CROSS-SECTIONAL VIEW

B-B' CROSS-SECTIONAL VIEW

PLAN VIEW

A–A' CROSS-SECTIONAL VIEW

B–B' CROSS-SECTIONAL VIEW

SEMICONDUCTOR OPTICAL DEVICE AND OPTICAL TRANSMISSION MODULE

BACKGROUND OF THE INVENTION

The present invention relates generally to a semiconductor optical device, and more particularly, to an external modulator integrated laser which operates at a transmission rate of 2.5 Gbits/s or higher, and an optical transmission module having the external modulator integrated laser mounted thereon.

At present, dense wavelength division multiplexing (DWDM) optical transmission which transmits optical signals of multiple wavelengths in a single optical fiber most typically uses a transmission system which enables long-range transmission at a transmission rate of 2.5 Gbits/s or higher, and in particular, 10 Gbits/s. Market demand for a transmission rate of 40 Gbits/s has recently been gradually increasing.

In the DWDM optical transmission, a grid wavelength with a wavelength band of 1.55 μm that realizes long-range optical transmission is defined in the ITU-T standards. The wavelength interval (frequency interval) of the grid wavelength is 0.4 nm (50 GHz) or 0.8 nm (100 GHz). It is therefore crucial that the oscillation wavelength of a semiconductor optical device to be used in such optical transmission fluctuates with the passage of time.

Light sources to be used in DWDM optical transmission include a small-sized, low-cost electro-absorption (EA) modulator distributed feedback (DFB) integrated laser (hereinafter called "EA/DFB integrated laser"). Particularly, a buried heterostructure (BH) having an optical waveguide structure, which forms an EA/DFB integrated laser and is planarized by burying a mesa with a semi-insulative semiconductor, such as iron doped indium phosphorus (Fe-InP), is typically used in DWDM optical transmission, since the oscillation wavelength of the laser portion is very stable.

A process of forming a BH using an n-type InP substrate will be briefly described below referring to FIGS. 6A to 6D and FIGS. 7E to 7G.

First, oxide films ($SiO_2$) 102 are formed on an n-type semiconductor substrate 101 by T-CVD (Thermal-Chemical Vapor Deposition), and the $SiO_2$ films 102 sandwiching that region of a laser portion 103 equivalent to a mesa are patterned. With the $SiO_2$ films 102 as masks, an n-type InP buffer layer 104, an n-type InGaAsP lower guide layer 105, a multi-quantum well (MQW) 106 having a well/barrier layer of InGaAsP, a p-type InGaAsP upper guide layer 107, and a p-type InP cap layer 108 are grown in order by selective area growth method called MO-CVD (Metal-Organic Chemical Vapor Deposition) (first multilayer growth: FIG. 6A)

With the presence of the $SiO_2$ masks in the laser portion 103, the selective growth effect makes the laser portion 103 thicker than an EA modulator portion 109. Further, changing the interval between the $SiO_2$ masks can change the photoluminescence wavelengths of the laser portion 103 and the EA modulator portion 109, which affect the characteristic of the EA/DFB integrated laser.

Thereafter, the $SiO_2$ masks 102 are removed, and only the p-type InP cap layer 108 of the laser portion 103 is etched to form a grating 110 in a part of the upper guide layer 107 by interference exposure (FIG. 6B).

Next, a p-type InP clad layer 111, a contact layer 112 of p-type InGaAsP and p-type InGaAs, and a p-type InP protection layer 113 are regrown by MO-CVD (second multilayer growth: FIG. 6C). The first multilayer and the second multilayer both generally use zinc (Zn) as a dopant for p-type InGaAsP, p-type InGaAs and p-type InP. Next, the p-type InP protection layer 113 is removed, and with an $SiO_2$ film 114 as a mask, mesas are formed in the laser portion 103 and the EA modulator portion 109 to a sufficient depth (e.g., 3 μm or so) from the position of the MQW 106 and with a width of 1 to 2 μm by dry etching or wet etching (FIG. 6D).

Thereafter, buried growth of an Fe-InP semi-insulative semiconductor 115 in the other regions than the mesas is carried out again, and then the $SiO_2$ film 114 is removed to form a BH (FIG. 7E).

Subsequently, the contact layer 112 directly above the mesa between the laser portion 103 and the EA modulator portion 109 is etched off, thereby forming an isolation groove to electrically isolate the laser portion 103 from the EA modulator portion 109. Further, the entire wafer is protected with a passivation film 116 by T-CVD. Thereafter, the passivation film 116 on the mesa regions of the laser portion 103 and the EA modulator portion 109 is removed to form a through hole. Further, a p-side electrode 117 of Ti/Pt/Au is vapor-deposited, and is patterned by ion-milling. Thereafter, the resultant wafer is polished until the wafer thickness becomes 100 to 150 μm, and an n-side electrode 118 of AuGe/Ni/Ti/Pt/Au is vapor-deposited to complete the wafer (FIG. 7F).

The wafer is cleaved into bars, the cleave facet of the device's rear side (laser side) is protected with a high reflection film 119 having a reflectance of 90% or greater, and the cleave facet of the device's front side (EA modulator side) is protected with a non-reflection film 120 having a reflectance of 1% or less, and finally the wafer is cleaved to chips (FIG. 7G).

FIG. 7G shows the cross-sections of the laser portion 103 and the EA modulator portion 109 of the EA/DFB integrated laser completed this way (cross-sectional view along B-B' and cross-sectional view along C-C').

To check the stability of the oscillation wavelength of the thus configured EA/DFB integrated laser with a BH, a temperature cycle test to intentionally apply a load to the laser was conducted as follows.

In the temperature cycle test, 50 or more cycles each consisting of a process of placing the EA/DFB integrated laser into a thermostatic chamber of a nitrogen atmosphere and increasing the environment temperature from −40° C. to +85° C. at a rate of about 10° C./minute, and a process of then cooling the device to −40° C. (or cooling the laser from +85° C. to −40° C., then increasing the temperature to +85° C.) are repeated. In the test, the oscillation wavelengths of eight devices were checked in around 150 cycles.

The test results showed that the wavelength fluctuation was very small (−9 to 0 pm) and the laser with the BH would be suitable for DWDM optical transmission.

As mentioned above, recently the market demand for 40-Gbits/s DWDM optical transmission is increasing gradually. To ensure a fast operation, the modulation band of the EA modulator needs to be made sufficiently large (e.g., the modulation band is desirably 35 GHz or greater in cases of operation at 40 Gbits/s). To achieve fast operation, the parasitic capacitance of the EA modulator portion should be made small, to about 0.1 to 0.2 pF.

It is known that in the BH of Fe-InP, Zn as a dopant for the p-type InP clad is likely to be interdiffused with Fe under a high temperature of around 600° C. at the time of buried growth. Therefore, the diffused Zn undesirably produces an uncontrollable parasitic capacitance or causes a sudden increase in capacitance in the mesa side, thereby adversely affecting the modulation band of the EA modulator. Recently, "R. Iga et al. 'Ru-doped Semi-Insulating Buried Heterostructure Laser Operating up to 100° C. for 10-Gbit/s Direct Modulation', ECOC 2005, Tu 4.5.2" has reported that a mesa side is buried with a semi-insulating semiconductor of ruthenium-doped indium phosphorus (Ru-InP). While the use of Ru has such an advantage as to make the capacitance of the EA modulator portion easily controllable, since Ru is hardly interdiffused with Zn, it is difficult to stably provide the material. It is therefore difficult to mass-produce semiconductor optical devices to which a Ru-InP buried structure is applied.

In cases of a ridge waveguide structure using an n-type InP semiconductor substrate, after a mesa is formed, the mesa side is buried with a dielectric substance of a low dielectric constant (about 1.5), such as a resin. At this time, because the substrate is not exposed to a very high temperature as done for the BH, interdiffusion which increases the capacitance does not occur. It is therefore possible to make the capacitance sufficiently small and it is easier to design the capacitor itself. It is thus very effective to apply the resin-buried ridge waveguide structure to the EA modulator or the like which operates at, for example, 40 Gbits/s.

A description will now be given of a fluctuation in the oscillation wavelength of the EA/DFB integrated laser in a case where, like the mesa structure of the EA modulator portion, the mesa structure of the laser portion employs a resin-buried ridge waveguide structure to make the fabrication of the EA/DFB integrated laser simpler. A temperature cycle test of 150 cycles or so was conducted on ten EA/DFB integrated lasers whose EA modulator portion and laser portion both have a resin-buried ridge waveguide structure, as done on an EA/DFB integrated laser with a BH. The test results showed a very large fluctuation in oscillation wavelength of −24 to +20 pm.

While this amount of wavelength fluctuation does not matter for a semiconductor optical device to be used in time division multiplexing (TDM) optical transmission, it is not preferable for a semiconductor optical device to be used in DWDM optical transmission in terms of reliability. The wavelength fluctuation seems to have originated from a very large stress applied to the mesa region according to a change in temperature because the difference in the coefficients of thermal expansion of the semiconductor forming the mesa and the resin burying the mesa side is large (several ppm/° C. v.s. for the semiconductor, and about 50 ppm/° C. for the resin). In the case of the BH, however, the mesa and the mesa side are of the same semiconductor material, and stress is hardly applied to the mesa, so that the oscillation wavelength is very stable.

The laser portion may have a BH and the modulator portion may have a ridge waveguide structure (FIG. 8) as described in "C. Rolland et al., 'InGaAsP-based Mach-Zehnder modulator for high-speed transmission systems', OFC '98 ThH1". Although the mesa side of the modulator portion is air in this document, the mesa width is the same as the width of the p-side electrode, so that no extra capacitance other than the PIN junction capacitance is produced in the mesa side. This achieves a low capacitance. Because the laser portion takes a semiconductor-buried BH, stress is not applied to the mesa, so that the oscillation wavelength is stable. When the material for the MQW is InGaAlAs, however, the MQW in the mesa side wall contacts air after the mesa is formed, so that the Al-based material, InGaAlAs, is likely to be oxidized as compared with the P-based material, InGaAsP, described in the document. It is necessary to carefully perform a pre-process thereafter to remove Al oxide immediately before forming the BH. If the BH is formed in the laser portion with an impurity, such as Al oxide, adhered to the mesa side wall, the impurity becomes a leak path or the like, for the laser injection current, thereby adversely affecting the reliability of the laser. Therefore, the use of an Al-containing material makes it very difficult to form a BH in the laser portion, and in actuality may cause a sudden fault.

SUMMARY OF THE INVENTION

Accordingly, it is an object of the invention to provide a high-yield, low-cost EA/DFB integrated laser which satisfies both a high-reliability DWDM optical transmission laser whose oscillation wavelength does not fluctuate with the passage of time and a fast-operable, low-capacitance modulator, regardless of the base material for forming the active layer of a semiconductor optical device.

To make the DWDM optical transmission and the low-capacitance modulator compatible with each other, it is effective to make the mesa structure of the laser portion different from the mesa structure of the modulator portion. That is, it is effective that the semiconductor laser portion takes a ridge waveguide structure which has air around the mesa, and the modulator portion takes a planarized ridge waveguide structure which has an organic insulator buried around the mesa.

A semiconductor optical device according to the invention has a modulator and a semiconductor laser integrated on a same semiconductor substrate, wherein the modulator and an optical waveguide structure forming the semiconductor laser take a ridge waveguide structure. An organic insulator is buried on both sides of the ridge waveguide structure of the modulator, and an organic insulator is not buried on both sides of the ridge waveguide structure of the semiconductor laser.

In other words, on the modulator side, an organic insulator is provided in a direction perpendicular to a direction in which an electrode is arranged as seen from a center axis of an optical waveguide, whereas on the semiconductor laser side, an organic insulator is not substantially provided in a direction perpendicular to a direction in which an electrode is arranged as seen from a center axis of an optical waveguide.

On the modulator side, the organic insulator is provided adjacent to an optical waveguide or a passivation film of the optical waveguide.

The organic insulator is preferably a low dielectric resin, and may be a polyimide resin or a benzocyclobutene resin.

The modulator may be an electro-absorption modulator or a Mach-Zehnder modulator.

The semiconductor laser may be a distributed feedback laser or a distributed Bragg reflector laser.

At least one of the modulator and the semiconductor laser may comprise a multi-quantum well, formed of indium gallium arsenide or indium gallium aluminum arsenide.

The invention can be used to fabricate an optical device that integrates a laser portion with an excellent characteristic for DWDM optical transmission, and a low-capacitance modulator portion which facilitates the design of the capacitor. The invention can provide a high-yield semiconductor optical device regardless of the base material for forming the active layer for forming the semiconductor optical device. Even in a modulator integrated laser including an InGaAsP-based MQW, the number of growths, including the condition for crystal growth, is reduced as compared with the case where the laser portion and the modulator portion both take a BH. This leads to reduction in time and cost involved in the wafer process. Further, a high-yield semiconductor optical device with excellent properties can be realized merely by adding one standard process as compared with the case where the laser portion and the modulator portion both take a resin-buried ridge waveguide structure.

DETAILED DESCRIPTION OF THE PREFERRED EMBODIMENTS

Preferred embodiments of the present invention will be described in detail below with reference to the accompanying drawings.

First Embodiment

A first embodiment of the invention will be described. Referring to FIGS. 1A to 1D and FIGS. 2E to 2G, a description will be given below of a method of fabricating an EA/DFB integrated laser in which an EA modulator portion 301 takes a polyimide-resin-buried ridge waveguide structure and a laser portion 302 takes a ridge waveguide structure having air around a mesa. FIGS. 1A to 1D and FIGS. 2E to 2G each show a plan view and a cross-sectional view.

Figure 1A:
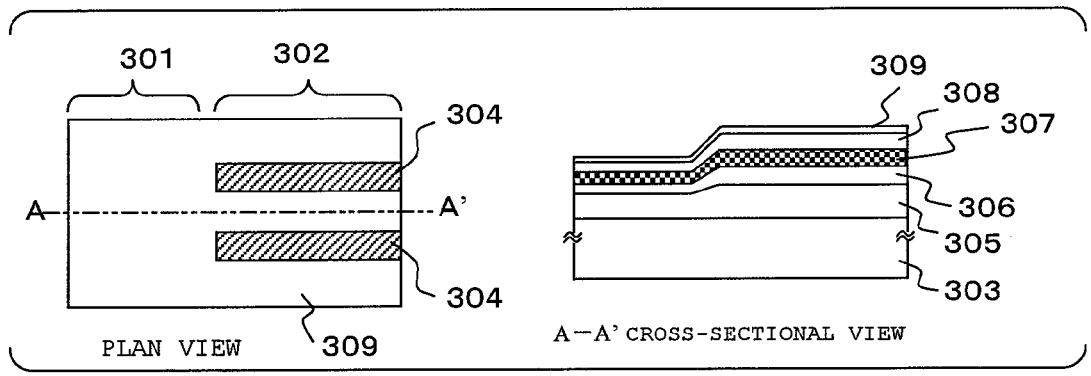
FIGS. 1A to 1D and FIGS. 2E to 2G are plan views and cross-sectional views of a semiconductor optical device according to a first embodiment of the present invention for explaining procedures of fabricating the semiconductor optical device.

First, SiO$_2$ films 304 are formed on an n-type semiconductor substrate 303 by T-CVD, and the SiO$_2$ films 304 sandwiching that region of a laser portion 302 equivalent to a mesa are patterned. With the SiO$_2$ films 304 as masks, an n-type InP buffer layer 104, an n-type InGaAsP lower guide layer 306, an MQW 307 having a well/barrier layer of InGaAsP, a p-type InGaAsP upper guide layer 308, and a p-type InP cap layer 309 are grown in order by selective growth called MO-CVD (first multilayer growth: FIG. 1A)

Figure 1B:
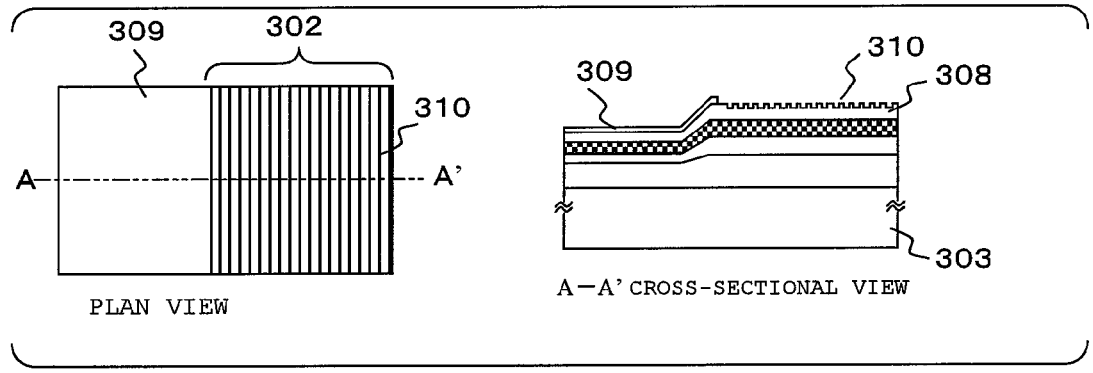

Thereafter, the SiO$_2$ masks 304 are removed, and only the p-type InP cap layer 309 of the laser portion 302 is etched to form a grating 310 in a part of the upper guide layer 308 by interference exposure (FIG. 1B).

Figure 1C:
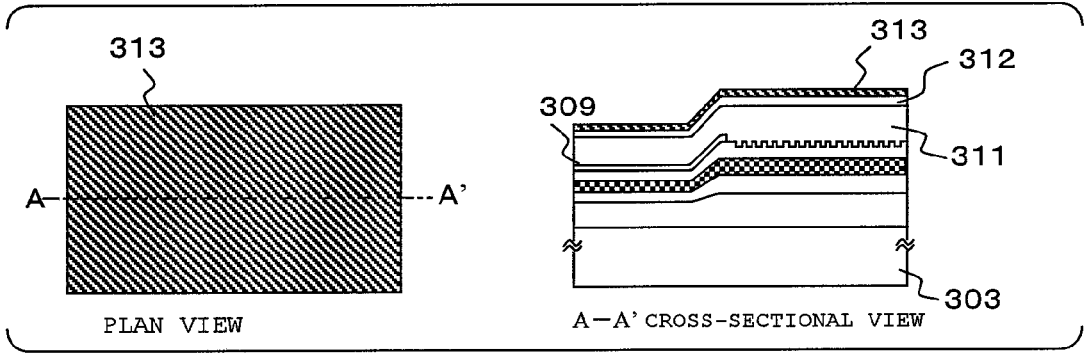

Next, a p-type InP clad layer 311, a contact layer 312 of p-type InGaAsP and p-type InGaAs, and a p-type InP protection layer 313 are regrown by MO-CVD (second multilayer growth: FIG. 1C).

Figure 1D:
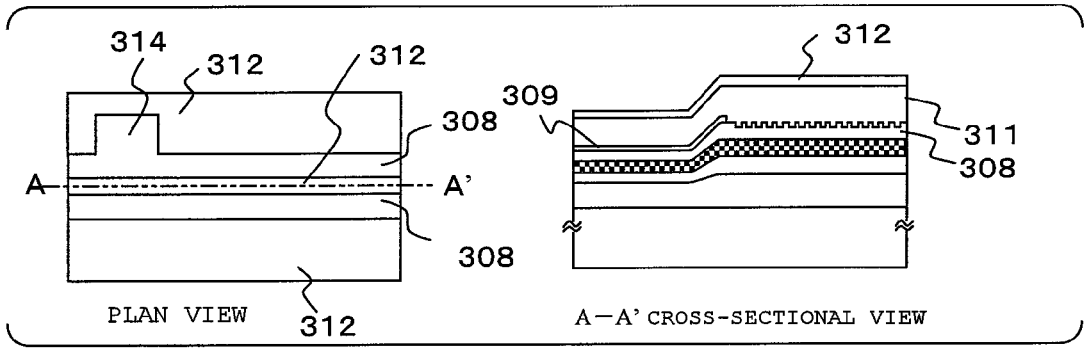

The first multilayer and the second multilayer both generally use zinc (Zn) as a dopant for a p-type semiconductor. Next, the p-type InP protection layer 313 is removed, and then mesas with a ridge waveguide structure with a width of 1 to 2 μm are formed in the EA modulator portion 301 and the laser portion 302 by dry etching or wet etching (FIG. 1D).

The mesa has a low-mesa ridge waveguide structure which generally has a depth shallow enough to stop etching at the interface of the p-type InP clad layer 311 and the p-type InGaAsP upper guide layer 308. This structure has an advantage in that the use of, for example, a mixed solution of hydrochloric acid and acetic acid can selectively stop etching at the interface, thereby ensuring fabrication of the semiconductor optical device in a very simple process. It is effective to etch also an electrode pad portion 314 to which wires for applying a voltage to the EA modulator portion 301 are to be bonded to the same depth as the mesa by patterning in order to make the capacitance of the EA modulator portion 301 as low as possible. Further, the contact layer 312 directly above the mesa between the EA modulator portion 301 and the laser portion 302 is etched off, thereby forming an isolation groove 312g.

Thereafter, the entire wafer is protected with a passivation film 315. Then, a polyimide resin 316 is applied to the entire wafer to a thickness thick enough to sufficiently bury the groove of the mesa (FIG. 2E), and the polyimide resin 316 on the entire wafer is etched back with the oxygen/argon mixed gas until the passivation film 315 directly above the mesa is exposed, and is planarized.

Figure 2E:
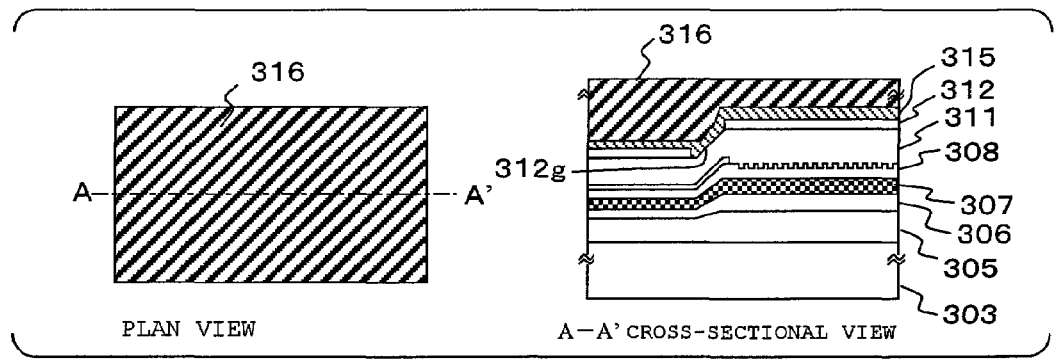
Figure 2F:
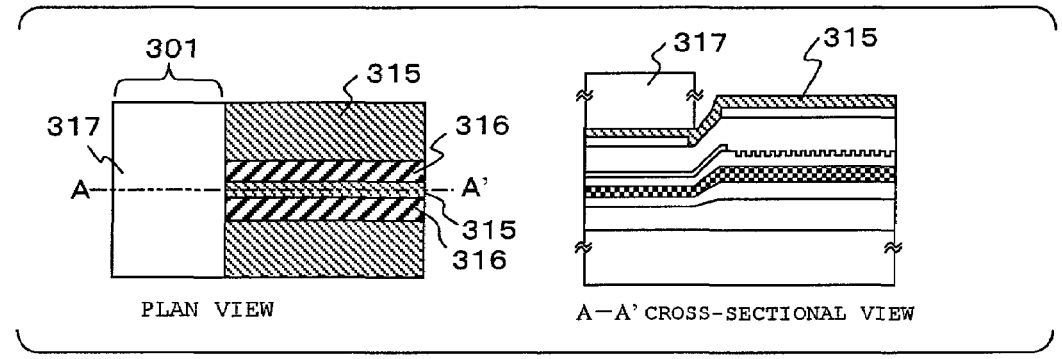

Further, the EA modulator portion 301 is covered with the photo-resist 317 and the polyimide resin 316 is further etched back to completely expose the passivation film 315 (FIG. 2F).

In the process, the photo-resist 317 and the passivation film 315 are simultaneously etched by etch-back with the oxygen/argon mixed gas. It is therefore necessary to perform etch-back long enough to be able to completely remove the polyimide resin 316 at the mesa side of the laser portion 302, particularly the mesa neck portion thereof, and make the photo-resist 317 covering the EA modulator portion 301 and the passivation film 315 at the mesa side of the laser portion 302 thick enough not to be removed during etch-back. Particularly, because the selection ratio of the polyimide resin 316 and the photo-resist 317 with respect to the etch-back with the oxygen/argon mixed gas is approximately 1:1, the thickness of the photo-resist 317 should be made 1.5 to 2 times the thickness of the remainder of the polyimide resin 316 (i.e., substantially equivalent to the mesa height).

Thereafter, the photo-resist 317 is removed, and the passivation film 315 on the mesa regions of the EA modulator portion 301 and the laser portion 302 are removed, thereby forming a through hole. Further, a p-side electrode 318 of Ti/Pt/Au is vapor-deposited, and is patterned by ion milling. Thereafter, the resultant wafer is polished until the wafer thickness becomes 100 to 150 μm, and an n-side electrode 319 of AuGe/Ni/Ti/Pt/Au is vapor-deposited to complete the wafer. The wafer is cleaved into bars, the cleave facet of the device's rear side (laser side) is protected with a high reflection film 320 having a reflectance of 90% or greater, and the cleave facet of the device's front side (EA modulator side) is protected with a non-reflection film 321 having a reflectance of 1% or less, and finally the wafer is cleaved to chips (FIG. 2G).

Figure 2G:
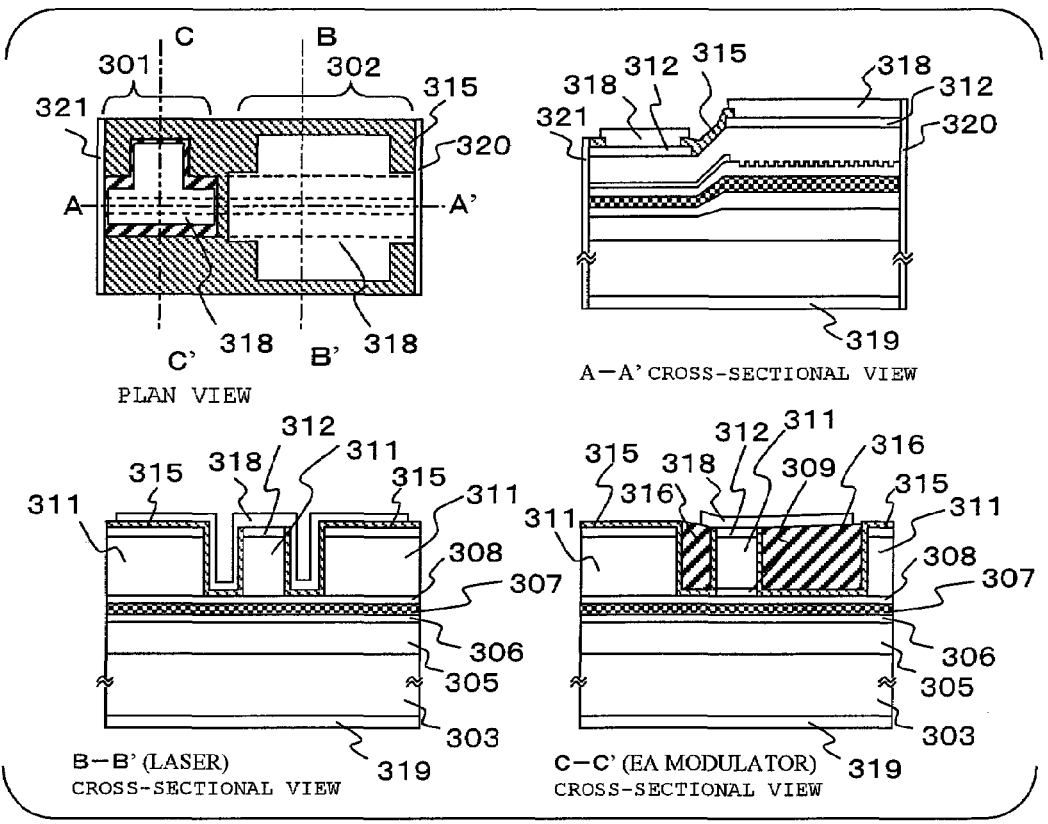

FIG. 2G shows the cross-sections of the laser portion 302 and the EA modulator portion 301 of the EA/DFB integrated laser completed this way (cross-sectional view along B-B' and cross-sectional view along C-C').

While selective growth using the SiO$_2$ mask is used in growing the first multilayer in the embodiment, a butt joint scheme may be used to separately perform crystal growth of the laser portion and the EA modulator portion and optically connect both portions together.

A temperature cycle test was conducted on fourteen EA/DFB integrated lasers with the configuration of the embodiment to check the stability of the oscillation wavelength of thereof. In the temperature cycle test, 150 or more cycles each consisting of a process of placing the EA/DFB integrated laser into a thermostatic chamber of nitrogen atmosphere and increasing the environment temperature from −40° C. to +85° C. at a rate of about 10° C./minute, and a process of then cooling the device to −40° C. (or cooling the laser from +85° C. to −40° C., then increasing the temperature to +85° C.) are repeated. The test results showed that the wavelength fluctuation was as small (−10 to 1 pm) as the wavelength fluctuation of the BH, and was stable. The modulation band of the EA modulator portion had a large band of 35 GHz or higher.

The configuration of the embodiment could realize an EA/DFB integrated laser for DWDM optical transmission which would operate at 40 Gbits/s.

The foregoing description has been given of cases where the mesa of the modulator portion has a ridge waveguide structure having a polyimide resin buried in the mesa, and the mesa of the semiconductor laser portion has a ridge waveguide structure having air at the mesa side. However, a similar advantage can be obtained for a case where the mesa of the modulator portion has a ridge waveguide structure having a benzocyclobutene resin buried in the mesa, and the mesa of the semiconductor laser portion has a ridge waveguide structure having air at the mesa side.

The semiconductor optical device with the configuration can be realized by applying a benzocyclobutene resin after forming the first multilayer, the grating, the second multilayer, the mesa, and the passivation film, then planarizing the mesa of the EA modulator portion with the benzocyclobutene resin through a photo process and an etch-back process, and completely removing the benzocyclobutene resin at the mesa side of the laser portion. The EA/DFB integrated laser with this configuration can also realize a semiconductor optical device for DWDM optical transmission which would show a small wavelength fluctuation and a large modulation band in the temperature cycle test.

A similar advantage can be obtained for a modulator integrated laser device with a high-mesa ridge structure which is etched sufficiently deep from the position of the active layer (MQW) and in which both sides of the ridge of the modulator portion are buried with a resin and both sides of the ridge of the laser portion are not buried with a resin (i.e., air is present on both sides).

Second Embodiment

Figure 3A:
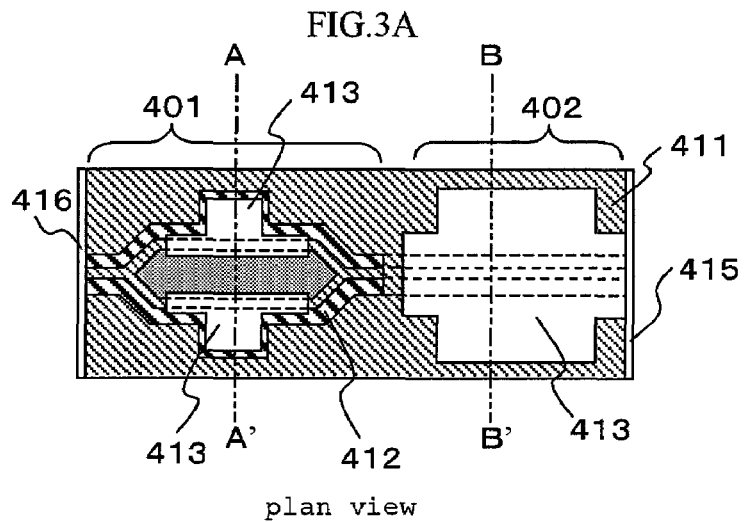
FIG. 3A and FIGS. 3B and 3C are respectively a plan view and cross-sectional views for explaining a semiconductor optical device according to a second embodiment of the invention.
Figure 3B:
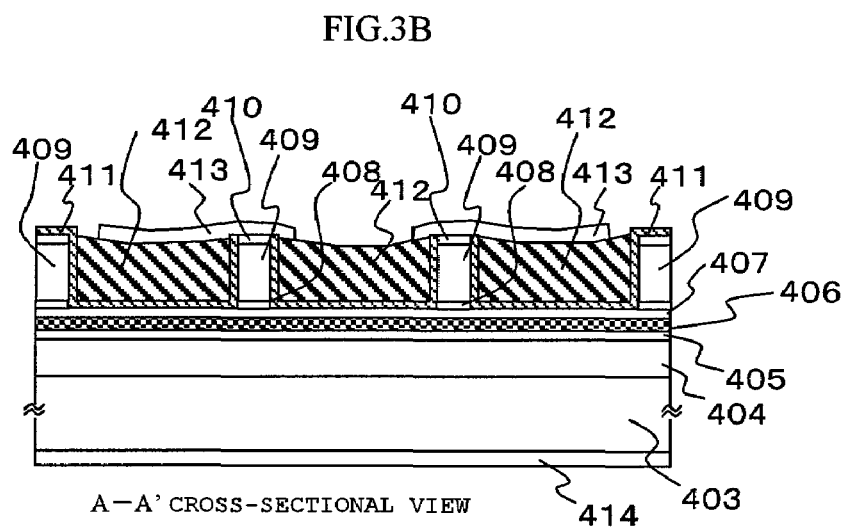
Figure 3C:
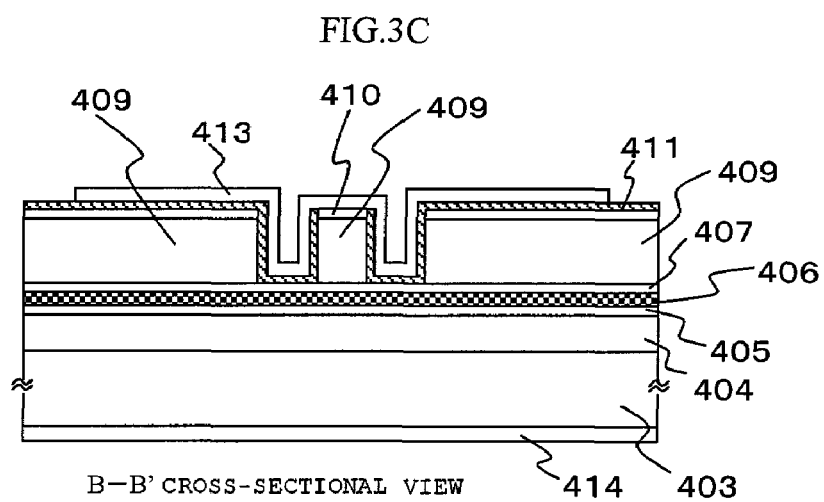

FIGS. 3A to 3C are diagrams for explaining a second embodiment of the invention. FIG. 3A is a plan view, FIG. 3B is a cross-sectional view along A-A', and FIG. 3C is a cross-sectional view along B-B'.

The following description of the embodiment will be given of a case where an external modulator is a Mach-Zehnder modulator. Specifically, the embodiment is a semiconductor optical device which has the integration of a Mach-Zehnder modulator portion 401 having a polyimide-resin buried ridge waveguide structure, and a laser portion 402 having a ridge waveguide structure having air around the mesa.

This device can be fabricated through substantially the same processes as described in the foregoing description of the first embodiment. First, an n-type InP buffer layer 404, an n-type InGaAsP lower guide layer 405, an MQW 406 of InGaAsP, a p-type InGaAsP upper guide layer 407, and a p-type InP cap layer 408 are grown on an n-type InP substrate 403 in the first multilayer growth process. The first multilayer growth may employ either the selective growth or the butt joint scheme. Further, after a grating is formed at the laser portion 402, a p-type InP clad layer 409, a contact layer 410, and a p-type InP protection layer are grown in the second multilayer growth process. Thereafter, a mesa forming process, a process of forming an isolation groove between the laser portion and the Mach-Zehnder modulator portion, and a process of forming a passivation film 411 are performed. Then, a polyimide resin 412 is applied to the entire wafer surface, and an etch-back is performed to planarize only the mesa side of the Mach-Zehnder modulator portion 401 with the polyimide resin 412 and completely remove the polyimide resin at the mesa side of the laser portion 402 by a method similar to the method used for the first embodiment.

Thereafter, a through-hole forming process, a process of forming a p-side electrode 413, a polishing process, and a process of forming an n-side electrode 414 are performed to complete the wafer. The wafer is cleaved into bars, a high reflection film 415 is coated on the cleave facet of the device's rear side (laser side), a non-reflection film 416 is coated on the cleave facet of the device's front side (Mach-Zehnder modulator side), and finally the bars are cleaved into chips to complete Mach-Zehnder modulator integrated laser devices.

It is apparent that the embodiment can also realize a semiconductor optical device for DWDM optical transmission which has a small oscillation wavelength fluctuation and a large modulation band. The semiconductor optical device may be modified so that a Mach-Zehnder modulator integrated laser device in which the mesa side of the Mach-Zehnder modulator portion 401 is planarized with a benzocyclobutene resin and the benzocyclobutene resin at the mesa side of the laser portion is completely removed can be provided with the same advantage.

Third Embodiment

Figure 4A:
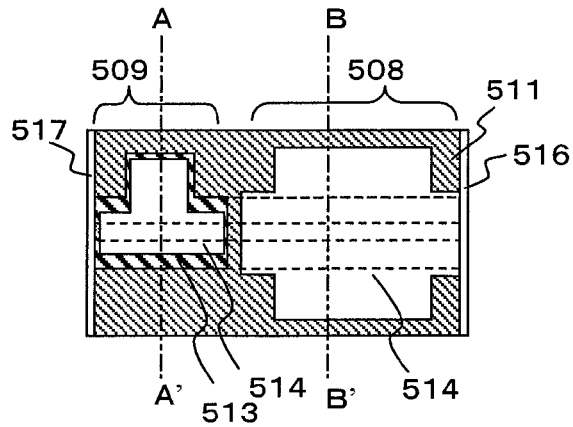
FIG. 4A and FIGS. 4B and 4C are respectively a plan view and cross-sectional views for explaining a semiconductor optical device according to a third embodiment of the invention.
Figure 4B:
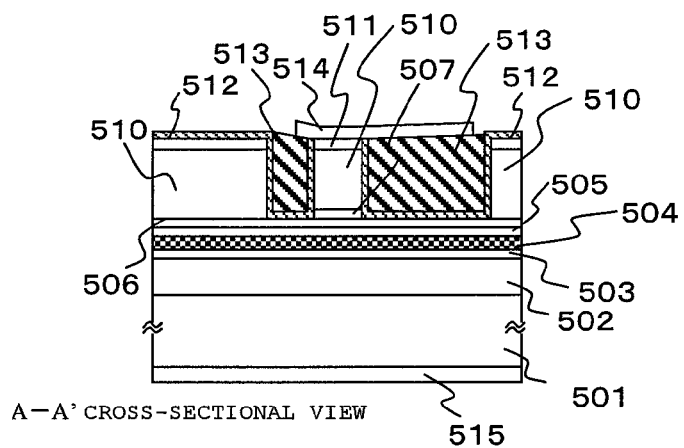
Figure 4C:
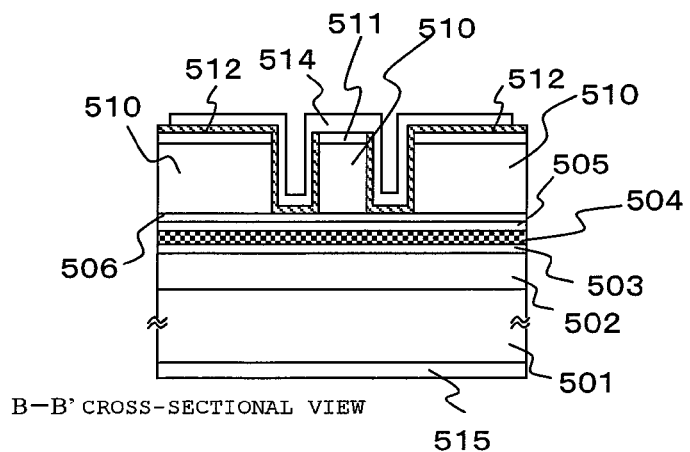

FIGS. 4A to 4C are diagrams for explaining a third embodiment of the invention. FIG. 4A is a plan view, FIG. 4B is a cross-sectional view along A-A', and FIG. 4C is a cross-sectional view along B-B'.

The following description of the embodiment will be given of an EA/DFB integrated laser with a ridge waveguide structure which uses InGaAlAs for an MQW.

A feature of InGaAlAs lies in the fact that the band offset $\Delta Ev$ of the valence-band is smaller and the band offset $\Delta Ec$ of the conduction-band is larger than those of InGaAsP. That is, the use of InGaAlAs in the laser portion ensures sufficiently strong electron confinement and uniform hole injection, so that electrons do not easily leak from the MQW even at a high temperature, thus making it possible to ensure a stable operation over a wide temperature range.

The use of InGaAlAs in the EA modulator portion can sufficiently confine electrons even if confinement of holes is made weaker to improve the chirp characteristic, making it possible to provide a large extinction ratio. Although it is difficult to providing a large extinction ratio at a low temperature with InGaAsP, InGaAlAs ensures a stable operation over a wide temperature range because of the feature of the band structure.

Therefore, the use of InGaAlAs for the MQW both in the laser portion and the EA modulator portion can easily provide an uncooled type device which does not require keeping an EA/DFB integrated laser at a constant temperature.

The following will describe a method of fabricating an EA/DFB integrated laser suitable for DWDM optical transmission and a fast operation using such an excellent material.

In the first multilayer growth, an n-type InP buffer layer 502, an n-type InGaAsP lower guide layer 503, an MQW 504 having a well/barrier layer of InGaAlAs, a p-type InGaAsP upper guide layer 505, a p-type InGaAsP etching stop layer 506, and a p-type InP cap layer 507 are formed on an n-type InP substrate 501. The p-type InGaAsP etching stop layer 506 is inserted to perform wet etching using the selection ratio of InP and InGaAsP at the time of forming a mesa with a ridge waveguide structure. This layer 506 is a very effective layer because the p-type InGaAsP upper guide layer 505 does not contact air even after formation of the mesa.

The first multilayer may be formed by using either selective growth of simultaneously growing a laser portion 508 and an EA modulator portion 509 or a butt-joint scheme of separately growing the laser portion 508 and the EA modulator portion 509 to optically connect both portions together. It is to be noted however that because of the use of an Al-based material for the MQW, a care should be taken in carrying out an Al oxide removing process in the case of the butt joint scheme.

After the first multilayer growth, a grating is formed at the p-type InGaAlAsP upper guide layer 505 of the laser portion 508, and a p-type InP clad layer 510, a contact layer 511 and a p-type InP protection layer are grown in the second multilayer growth process. Thereafter, a low-mesa ridge waveguide structure (in which the mesa is deep enough to stop etching at the interface between the p-type InP clad layer 510 and the p-type InGaAsP etching stop layer 506) is formed using, for example, a mixed solution of hydrochloric acid and acetic acid. Then formation of an isolation groove, formation of a passivation film 512, formation of a through hole, application of a polyimide resin 513, etch-back of the polyimide resin 513, formation of a p-side electrode 514, polishing, and formation of an n-side electrode 515 are performed to fabricate a wafer.

Finally, the wafer is cleaved into bars after which a high reflection film 516 and a non-reflection film 517 are coated and the bars are cleaved into chips to complete an EA/DFB integrated laser with an Al-based ridge waveguide structure.

The EA/DFB integrated laser of the embodiment was also subjected to the temperature cycle test as done for the first embodiment, and the test results showed that the laser device had a small wavelength fluctuation of −9 to 2 pm and a large modulation band.

Although an Al-based material is used for the MQW in the embodiment, unlike the EA/DFB integrated laser with the semiconductor-buried BH, the EA/DFB integrated laser of the third embodiment has no factor to bring about a sudden defect, so that the laser device can be fabricated stably with a high yield.

It is apparent that an EA/DFB integrated laser with a ridge waveguide structure, in which the mesa of the EA modulator portion 509 has a ridge waveguide structure that is planarized with a benzocyclobutene resin and air is present on the mesa side of the laser portion, can obtain the same advantage.

Further, a semiconductor optical device for DWDM optical transmission which has a small wavelength fluctuation and a large modulation band can be realized by employing a ridge waveguide structure of the Mach-Zehnder modulator integrated laser device using an Al-based material where the mesa of the Mach-Zehnder modulator portion is planarized with a benzocyclobutene resin and a ridge waveguide structure where air is present at the mesa side of the laser portion.

Fourth Embodiment

Figure 5:
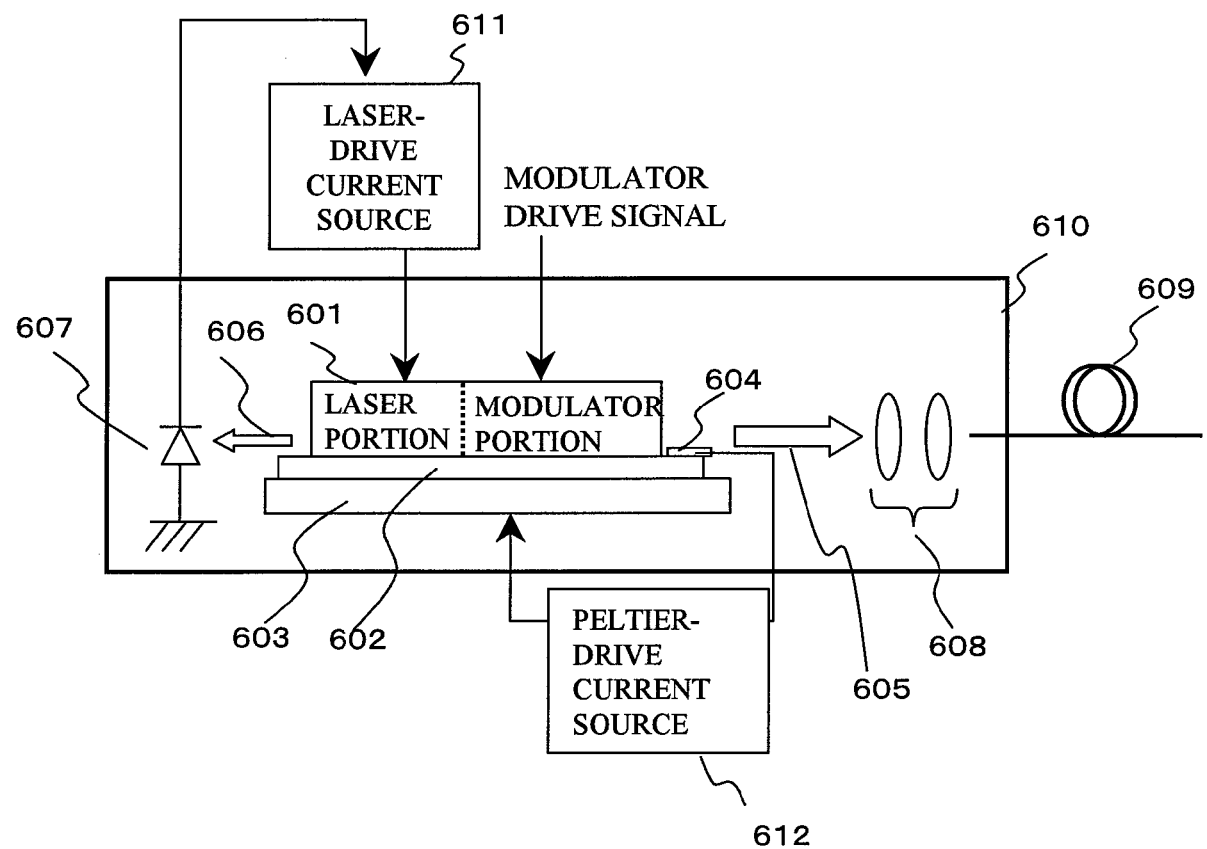
FIG. 5 is a diagram for explaining an optical transmission module according to a fourth embodiment of the invention.
Figure 6A:
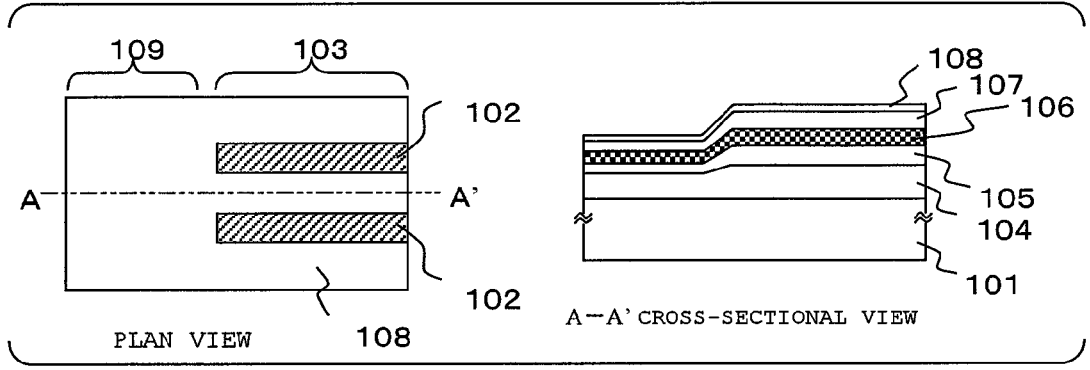
FIGS. 6A to 6D and FIGS. 7E to 7G are cross-sectional views of a conventional semiconductor optical device for explaining procedures of fabricating the semiconductor optical device.
Figure 6B:
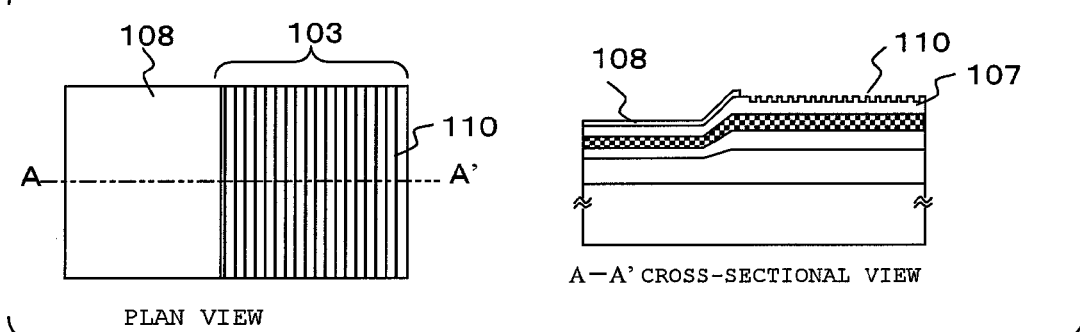
Figure 6C:
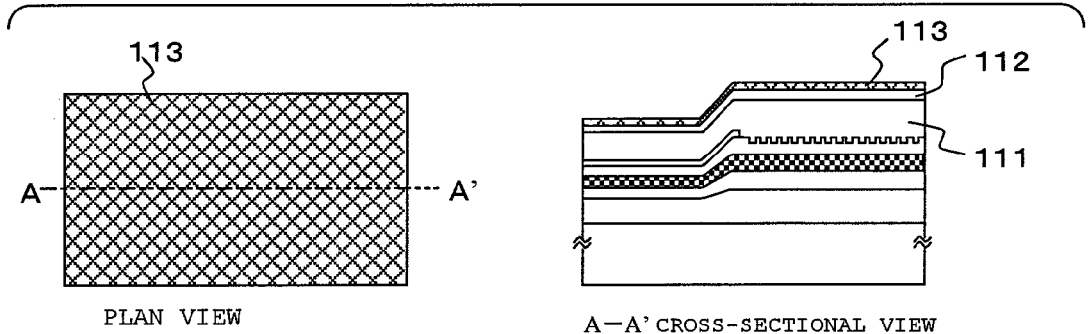
Figure 6D:
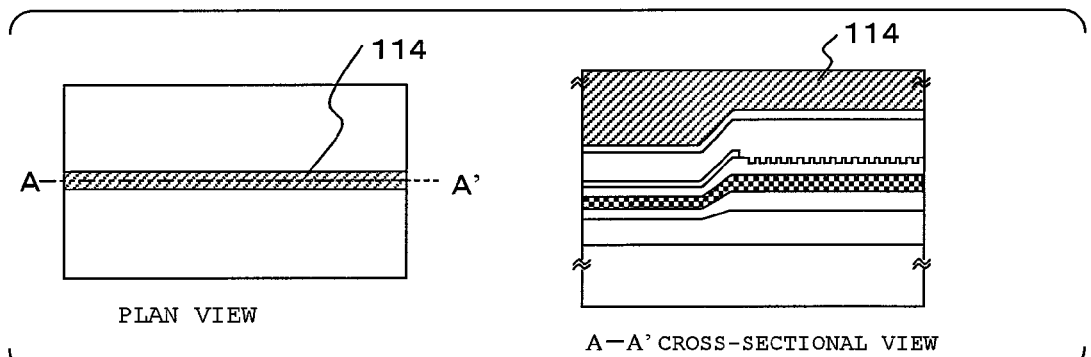
Figure 7E:
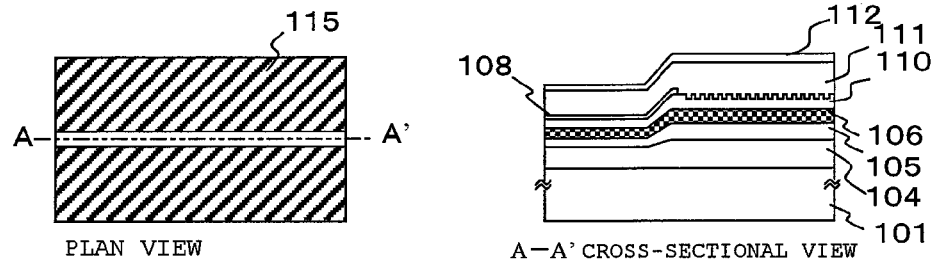
Figure 7F:
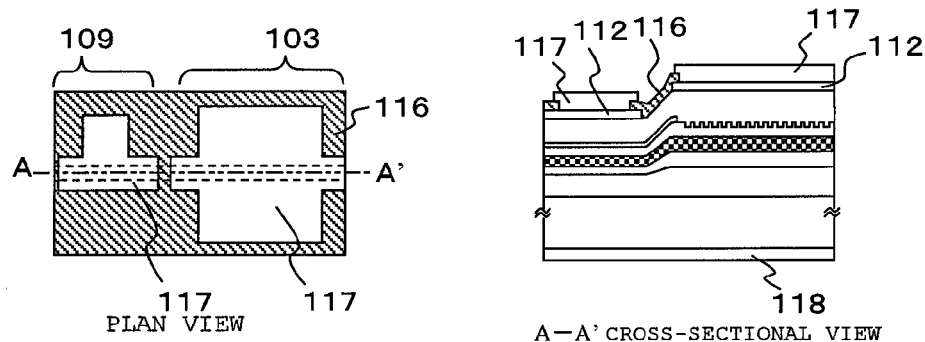
Figure 7G:
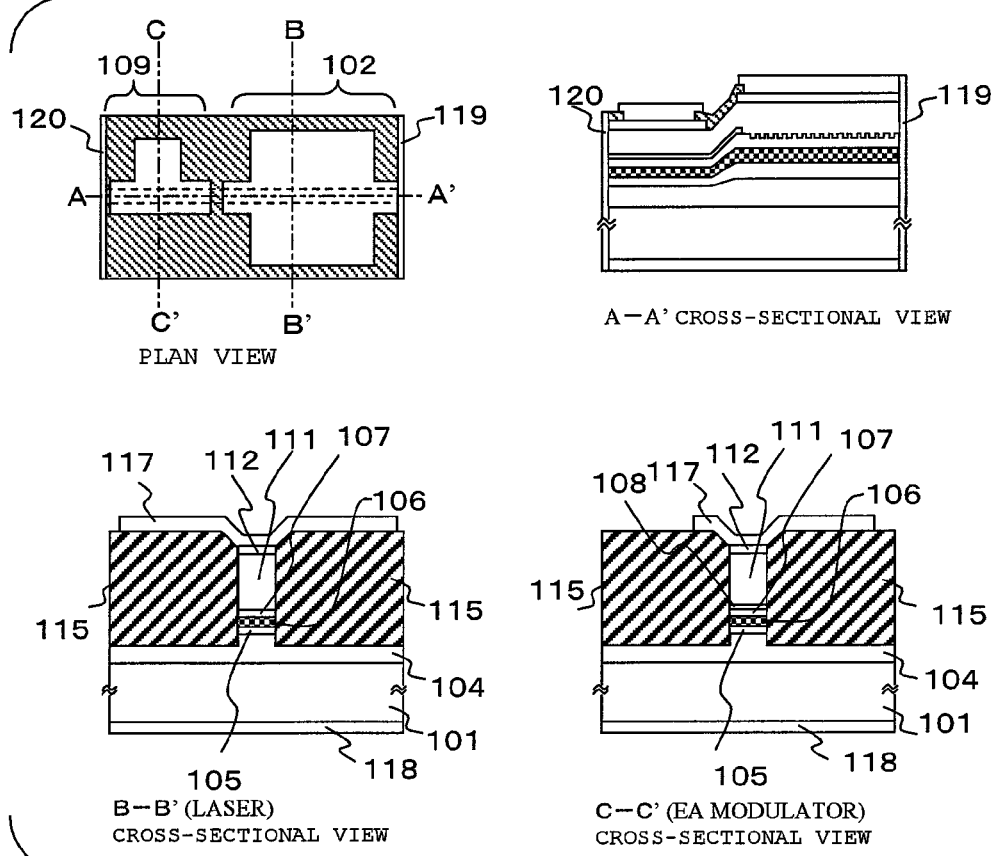
Figure 8:
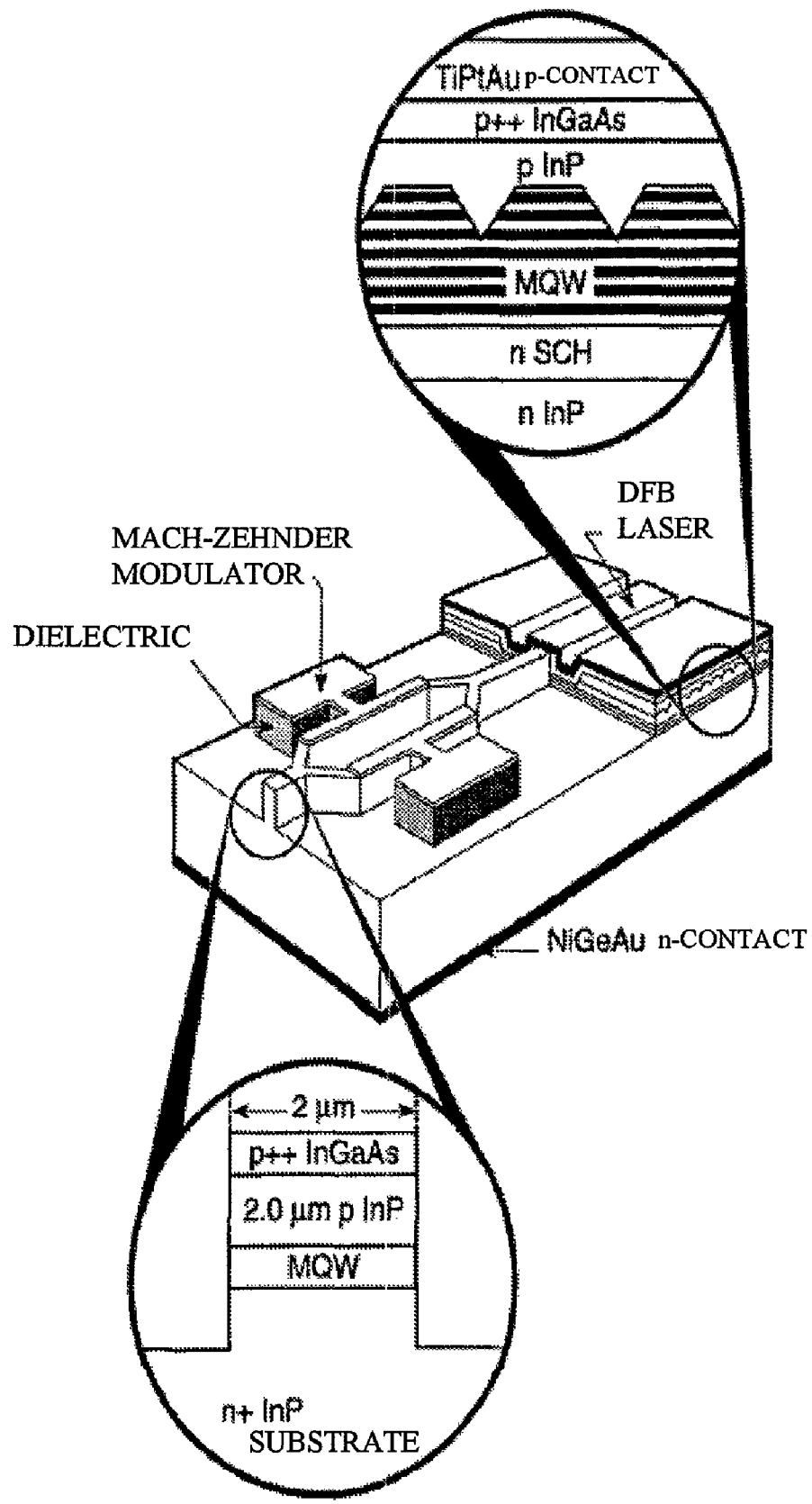
FIG. 8 is a diagram for explaining another conventional semiconductor optical device.

FIG. 5 is a diagram for explaining an optical transmission module in which a semiconductor optical device of any one of the first to third embodiments, whose modulator has a resin-buried ridge waveguide structure and a DFB laser with a ridge waveguide structure where air is present around the mesa, is mounted.

The optical transmission module includes a semiconductor optical device 601, a chip carrier 602 having the semiconductor optical device 601 mounted therein, a Peltier substrate 603, a thermistor 604, a monitor photodiode 607 which receives a rearward output light 606, a lens 608 for coupling a forward output light 605 to an optical fiber 609, and a package 610 accommodating those components.

In the optical transmission module, APC (Auto Power Control) is performed to feed back a change in the power of the rearward output light 606 received by the monitor photodiode 607 to a laser-drive current source 611 to always keep the forward output light 605 constant. In addition, ATC (Auto Temperature Control) is performed to detect the temperature of the semiconductor optical device 601 by feeding back a change in the temperature to a Peltier-drive current source 612 to always keep the temperature of the semiconductor optical device 601 constant.

A 150-cycle temperature cycle test was conducted on the optical transmission module of the embodiment, and the test results showed that the optical transmission module had a small wavelength fluctuation and a large modulation band.

Clearly, an optical transmission module, in which the uncooled type semiconductor optical device of the third embodiment is mounted, can also enable a fast operation suitable for DWDM optical transmission.

Although several embodiments of the invention have been described herein, the invention is not limited to those embodiments, and may be modified in various other forms within the spirit and scope of the invention.

The invention can provide a high-yield, low-cost modulator integrated laser which satisfies both a high-reliability DWDM optical transmission laser, whose oscillation wavelength does not fluctuate with the passage of time, and a fast-operable low-capacitance external modulator, regardless of the base material for forming an active layer in a semiconductor optical device.

What is claimed is:

1. A semiconductor optical device including an optical waveguide structure having a modulator and a semiconductor laser integrated on a same semiconductor substrate, wherein
    the optical waveguide structure has a multiple quantum well,
    in the optical waveguide structure, both the modulator and the semiconductor laser have a low-mesa ridge waveguide structure having a depth which is etched shallower than the multiple quantum well,
    an organic insulator is buried on both sides of the ridge waveguide structure of the modulator, and
    an organic insulator is not buried on both sides of the ridge waveguide structure of the semiconductor laser.

2. A semiconductor optical device including an optical waveguide structure having a modulator and a semiconductor laser integrated on a same semiconductor substrate, wherein
    the optical waveguide structure has a multiple quantum well,
    in the optical waveguide structure, both the modulator and the semiconductor laser have a low-mesa ridge waveguide structure having a depth which is etched shallower than the multiple quantum well,
    on the modulator side, an organic insulator is provided in a direction perpendicular to a direction in which an electrode is arranged as seen from a center axis of an optical waveguide, and
    on the semiconductor laser side, an organic insulator is not provided in a direction perpendicular to a direction in which an electrode is arranged as seen from a center axis of an optical waveguide.

3. The semiconductor optical device according to claim 1, wherein, on the modulator side, the organic insulator is provided adjacent to an optical waveguide or a passivation film of the optical waveguide.

4. The semiconductor optical device according to claim 1, wherein the organic insulator is a polyimide resin.

5. The semiconductor optical device according to claim 1, wherein the organic insulator is a benzocyclobutene resin.

6. The semiconductor optical device according to claim 1, wherein the modulator is one of an electro-absorption modulator and a Mach-Zehnder modulator.

7. The semiconductor optical device according to claim 1, wherein the semiconductor laser is one of a distributed feedback laser and a distributed Bragg reflector laser.

8. The semiconductor optical device according to claim 1, wherein at least one of the modulator and the semiconductor laser comprises a multi-quantum well formed of indium gallium arsenide or indium gallium aluminum arsenide.

9. The semiconductor optical device according to claim 1, wherein the modulator is operable at a transmission rate of 2.5 Gbits/s or higher.

10. An optical transmission module having the semiconductor optical device of claim 1.

11. A semiconductor optical device including an optical waveguide structure having a modulator and a semiconductor laser integrated on a same semiconductor substrate, wherein the optical waveguide structure has a multiple quantum well, in the optical waveguide structure, both the modulator and the semiconductor laser have a high-mesa ridge waveguide structure having a depth which is etched deeper than the multiple quantum well, an organic insulator is buried on both sides of the ridge waveguide structure of the modulator, and an organic insulator is not buried on both sides of the ridge waveguide structure of the semiconductor laser.

12. The semiconductor optical device according to claim 11, wherein, on the modulator side, the organic insulator is provided adjacent to an optical waveguide or a passivation film of the optical waveguide.

13. The semiconductor optical device according to claim 11, wherein the organic insulator is a polyimide resin.

14. The semiconductor optical device according to claim 11, wherein the organic insulator is a benzocyclobutene resin.

15. The semiconductor optical device according to claim 11, wherein the modulator is one of an electro-absorption modulator and a Mach-Zehnder modulator.

16. The semiconductor optical device according to claim 11, wherein the semiconductor laser is one of a distributed feedback laser and a distributed Bragg reflector laser.

17. The semiconductor optical device according to claim 11, wherein at least one of the modulator and the semiconductor laser comprises a multi-quantum well formed of indium gallium arsenide or indium gallium aluminum arsenide.

18. The semiconductor optical device according to claim 11, wherein the modulator is operable at a transmission rate of 2.5 Gbits/s or higher.

19. A semiconductor optical device including an optical waveguide structure having a modulator and a semiconductor laser integrated on a same semiconductor substrate, wherein the optical waveguide structure has a multiple quantum well, in the optical waveguide structure, both the modulator and the semiconductor laser have a high-mesa ridge waveguide structure having a depth which is etched deeper than the multiple quantum well, on the modulator side, an organic insulator is provided in a direction perpendicular to a direction in which an electrode is arranged as seen from a center axis of an optical waveguide, and on the semiconductor laser side, an organic insulator is not provided in a direction perpendicular to a direction in which an electrode is arranged as seen from a center axis of an optical waveguide.

* * * * *